United States Patent [19]

Ryun et al.

[11] Patent Number: 5,484,737
[45] Date of Patent: Jan. 16, 1996

[54] METHOD FOR FABRICATING BIPOLAR TRANSISTOR

[75] Inventors: Byung-Ryul Ryum; Tae-Hyeon Han; Soo-Min Lee; Deok-Ho Cho; Seong-Hearn Lee; Jin-Young Kang, all of Daejeon, Rep. of Korea

[73] Assignees: Electronics & Telecommunications Research Institute, Daejeon; Korea Telecommunication Authority, Seoul, both of Rep. of Korea

[21] Appl. No.: 357,244

[22] Filed: Dec. 13, 1994

[51] Int. Cl.⁶ ............................................. H01L 21/8222
[52] U.S. Cl. ........................ 437/31; 437/89; 437/131; 437/128; 148/DIG. 59; 148/DIG. 67
[58] Field of Search ................................ 437/31, 89, 32, 437/90, 126, 128, 131; 148/DIG. 11, DIG. 59, DIG. 67, DIG. 64, DIG. 72

[56] References Cited

U.S. PATENT DOCUMENTS

| | | | |
|---|---|---|---|
| 4,849,371 | 7/1989 | Hansen et al. | 437/31 |
| 4,851,362 | 7/1989 | Suzuki | 437/31 |
| 5,008,207 | 4/1991 | Blouse et al. | 437/31 |
| 5,039,624 | 8/1991 | Kadota | 437/31 |
| 5,326,718 | 7/1994 | Klose et al. | 437/89 |
| 5,391,503 | 2/1995 | Miwa et al. | 437/31 |

*Primary Examiner*—Tuan H. Nguyen
*Attorney, Agent, or Firm*—Larson and Taylor

[57] ABSTRACT

Disclosed is a fabrication of a bipolar transistor with a super self-aligned vertical structure in which emitter, base and collector are vertically self-aligned, the fabrication method comprising the steps of forming a conductive buried collector region in a silicon substrate by using ion-implantation of an impurity and thermal-annealing; sequentially forming several layers; selectively removing the nitride and polysilicon layers to form a pattern; sequentially forming a silicon oxide layer, a third layer and a silicon oxide layer thereon; forming a patterned photoresist layer thereon to define active and inactive regions and removing several layers on the active region to form an opening; forming a side wall on both sides of the opening; forming a collector on a surface portion of the buried collector region up to a lower surface of the polysilicon layer; removing the side wall and the third nitride layer to expose a side surface of the second polysilicon layer; selectively forming a base on an upper surface of the collector including a side surface of the polysilicon layer; forming side wall oxide layer on both sides of the base and the silicon oxide to define an emitter region; forming an emitter on the base; and forming electrodes thereon. In the method, an active region is defined by a photolithography, and thereby a trench isolation acting as factors of lowering in integration and device-performance can be omitted in the method. As a result, fabrication sequence can be simplified and integration can be improved.

12 Claims, 4 Drawing Sheets

METHOD FOR FABRICATING BIPOLAR TRANSISTOR

BACKGROUND OF THE INVENTION

1. Field of the Invention

The present invention relates to fabrication of a semiconductor device, and more particularly to a method for fabricating a bipolar transistor in which emitter, base and collector are vertically self-aligned.

2. Description of the Prior Art

To enhance operation characteristics of a semiconductor switching device in the semiconductor field, several types of hereto-junction bipolar transistors have been developed. Typical one of them has a SiGe base which is substituted for a silicon base and has a characteristic of narrowing in energy band gap and grading dependently upon Ge content of the SiGe base.

Since such a hereto-junction bipolar transistor, similar to a well-known homo-junction transistor, is fabricated by using a polysilicon as a material for forming base and emitter regions as well as an impurity diffusing Source of the emitter region and using a SiGe base so as to increase an emitter injection efficiency, and the base region is formed by an ultra-thin film doped with an impurity of high concentration, the hereto-junction bipolar transistor is significantly improved in a current gain and a switching speed.

Recently, as the integration of a semiconductor device is increasingly enhanced, i.e. as a semiconductor device is further scaled down in size, a selectively epitaxial growth has been developed to reduce a parasitic capacitance occurring in a base on an active region of the device and occurring between base and collector thereof. Also, to form a thin base electrode, a metallic silicide ($TiSi_2$) in place of a polysilicon is used.

FIG. 1 shows the construction of a prior art hereto-junction bipolar transistor in which a base is formed by a super self-aligned selectively epitaxial grown.

The fabricating method of the prior art hetero-junction bipolar transistor will be described below with reference to FIG. 1.

First, after sequentially forming an $n^+$ type subcollector 1, an $n^+$ type collector 3 and a collector sinker 16 on a substrate 1, a trench isolation is carried out to form a trench in the substrate 1. Then, an insulating material is filled into the trench to form an insulating layer 4 for device-isolating.

Also, an active region of the transistor is defined by forming a pattern composed of an insulating layer 5, a p+ type polysilicon layer 6, an insulating layer 7 and a side wall nitride layer 8, and then an impurity is ion-injected into the active region to form an n-type collector region 9, whereby a high-current characteristic of the transistor can be improved.

Next, in the active region formed thus, a SiGe base 10 serving as an intrinsic base and a polysilicon layer 11 for electrically connecting between the p+ type polysilicon layer 6 and the base 10 are sequentially grown by using a gas source MBE (molecular beam epitaxy). Therefore, a parasitic capacitance region formed between the collector and the base is limited within a width of the polysilicon layer 11 only.

Finally, after formation of a side wall insulating layer 12 on the intrinsic base 10 by a well-known anisotropic etching method, an emitter 13 is self-aligned and electrodes 15 is formed thereon, as shown in FIG. 1.

As described above, the intrinsic base 10 is composed of SiGe so as to increase an emitter injection efficiency, and the collector-base and emitter-base all are self-aligned. Also, since a parasitic capacitance region of the base is limited within a region corresponding to the side wall nitride layer 8 and the side wall insulating layer 12, the parasitic capacitance can be reduced dependently on controlling the total width of the side wall nitride and insulating layers 8, 12.

However, in fabrication sequence, it is not preferable to form the polysilicon layer 11 of a predetermined pattern by using a horizontal wet-etching of the insulating layer 5 and to define the parasitic capacitance region between the collector and the base, because such a fabrication sequence is seriously lowered in a uniform stability and a reproduction thereof. As a result, an performance of the device fabricated thus is seriously lowered.

Furthermore, in order to form the base 10 and the polysilicon layer 11, an extremely slow, selective thin film growth must be performed two times. Since component materials of them also are different from each other, the forming processes of them are very complicated. Thus, there arises the problem that a yield of production is lowered.

In addition, if a polysilicon is extremely slightly grown on the thin film base 10, there arises the problem that such an extremely thin film base exerts a seriously bad influence on the device due to occurrence of a defect therein.

SUMMARY OF THE INVENTION

It is an object oil the present invention to provide a method for fabricating a bipolar transistor in which emitter, base and collector are vertically self-aligned so as to simplify fabrication sequence thereof and improve integration and performance thereof.

According to the aspect of the present invention, the method for fabricating a bipolar transistor comprising the steps of forming a conductive buried collector region in a silicon substrate by using ion-implantation of an impurity and thermal-annealing; sequentially forming a first silicon oxide layer, a first nitride layer, a first polysilicon layer, an oxide layer, a second nitride layer and a second polysilicon layer doped with an impurity; selectively removing the second nitride and second polysilicon layers to form a pattern; sequentially forming a second silicon oxide layer, a third nitride layer and a third silicon oxide layer thereon; forming a patterned photoresist layer thereon to define active and inactive regions and removing several layers on the active region to form an opening; forming a side wall on both sides of the opening; forming a collector on a surface portion of the buried collector region up to a lower surface of the second polysilicon layer; removing the side wall and the third nitride layer to expose a side surface of the second polysilicon layer; selectively forming a base on an upper surface of the collector including a side surface of the second polysilicon layer; forming a first side wall oxide layer on both sides of the base and the second silicon oxide to define an emitter region; forming an emitter on the base; and forming electrodes thereon.

In this method, the step of removing the several layers on the active region to form the opening further comprises forming a second side wall oxide layer at an exposed side surface of the first polysilicon layer.

In this method, the step of forming the second side wall oxide layer comprises removing the oxide layer and the first polysilicon layer formed on the active region, performing a thermal-annealing to oxidize an exposed portion of the first polysilicon layer and to form a first side wall oxide layer therein, and removing the first nitride and the first silicon oxide layers on the active region to expose a surface portion of the buried collector region.

In this method, the step of forming the collector comprises simultaneously performing impurity-injection together with a selective crystal growth, thereby allowing the collector to have a conductivity.

In this method, the step of forming the collector comprises forming a single crystal silicon layer on the exposed surface of the buried collector region by a selective crystal growth before injecting an impurity into the single crystal silicon layer.

In this method, the base is composed of a single crystal SiGe layer doped with an impurity having high concentration of $1\times10^{18} cm^{-3}$ or more.

In this method, the base is composed of one of a SiGe/Si layer and a Si/SiGe/Si layer.

In this method, Ge content of the base is linearly changed between bottom and top of the base. Also, Ge content of the base is constant in the range of 3% or less.

In this method, Ge content of the base is linearly changed between bottom and top of the base in the range of from 30% to 0%.

In this method, Ge content of the base is constant between bottom and a predetermined height of the base in the range of 30% or less and is linearly changed between the predetermined height and top of the base in the range of 30% to 0%.

In this method, Ge content of the base is linearly changed between bottom and a predetermined height of the base in the range of 0% to 30% and changed between the predetermined height and top of the base in the range of 30% to 0%.

In this method, the first side wall oxide layer is composed of one of a BSG containing boron and a PSG containing phosphorous.

By the fabricating method, an active region is defined by a photolithography, and thereby a trench isolation acting as factors of lowering in integration and device-performance can be omitted in the method. As a result, fabrication sequence can be simplified and integration can be improved.

Also, a parasitic capacitance can be significantly reduced because insulating layers formed between a substrate and an interconnection electrode can be controlled by several thin film which are patterned by the photolithography. As a result, reproduction of bipolar transistors and a yield of production thereof can be largely improved.

BRIEF DESCRIPTION OF THE DRAWINGS

This invention may be better understood and its object will become apparent to those skilled in the art by reference to the accompanying drawings as follows.

DESCRIPTION OF THE PREFERRED EMBODIMENT(S)

Figure 1:
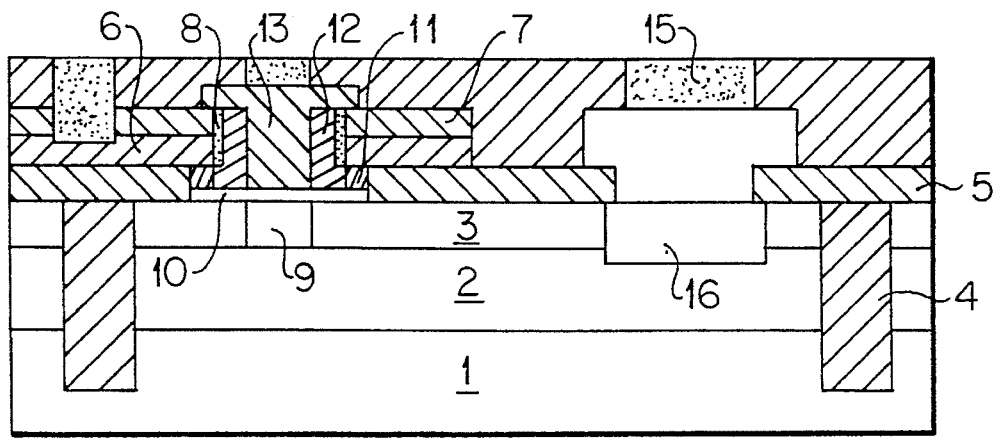
FIG. 1 is a cross-sectional view showing a typical construction of a prior art hetero-junction bipolar transistor in which a base is formed by a super self-aligned selectively epitaxial grown.
Figure 2:
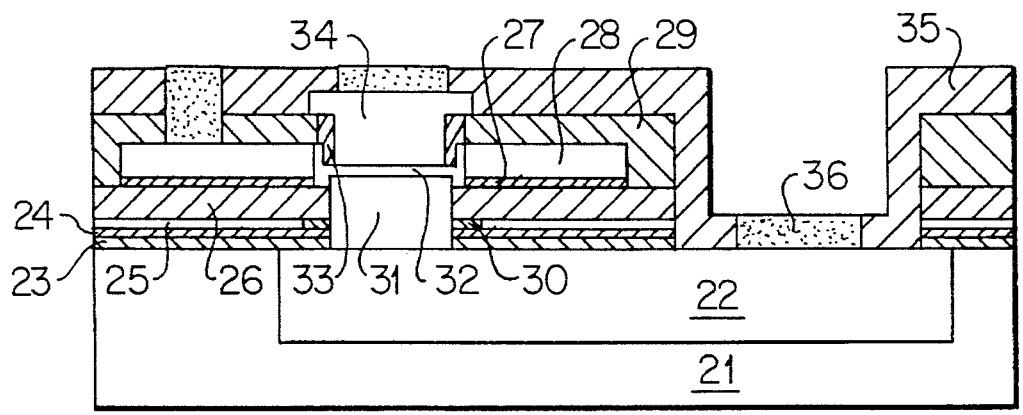
FIG. 2 is a cross-sectional view showing the construction of the bipolar transistor which is fabricated by the fabricating method of the present invention.

Referring to FIG. 2, in the bipolar transistor fabricated by the method of the present invention, because emitter 34, base 32 and collector 31 is vertically self-aligned, it is possible to change the emitter and the collector to each other.

Also, because an active region is defined by a well-known photolithography in the art, it is not necessary to form a trench for device-isolating.

Hereinafter, the fabricating method of a bipolar transistor according to the present invention will be described in detail with reference to FIGS. 3A to 3J.

Figure 3A:
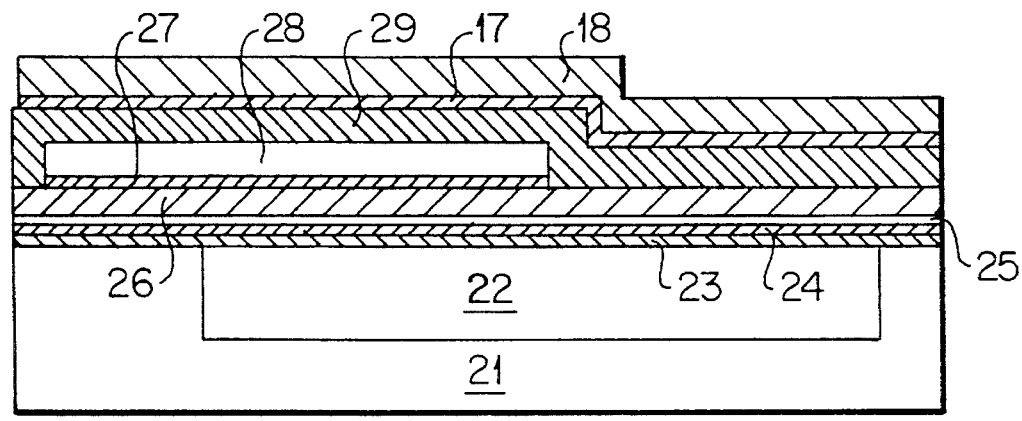
FIGS. 3A to 3J are cross-sectional views showing the processes for fabricating the bipolar transistor in accordance with the embodiment of the present invention.

As shown in FIG. 3A, an impurity of high concentration is injected in a silicon substrate 21 by ion-implantation and annealed to form a conductive buried collector region 22. Next, on the silicon substrate 21, several layers, for example a $SiO_2$ layer 23, a nitride layer 24, a polysilicon layer 25, an oxide layer 26, a nitride layer 27 and a conductive polysilicon layer 28 doped with an impurity, are sequentially formed. The nitride and polysilicon layers 27, 28 then are partially removed to form a pattern. Also, a silicon oxide layer 29, a nitride layer 17 and a silicon oxide layer 18 are sequentially formed thereon. As a result, the structure shown in FIG. 3A is fabricated.

Figure 3B:
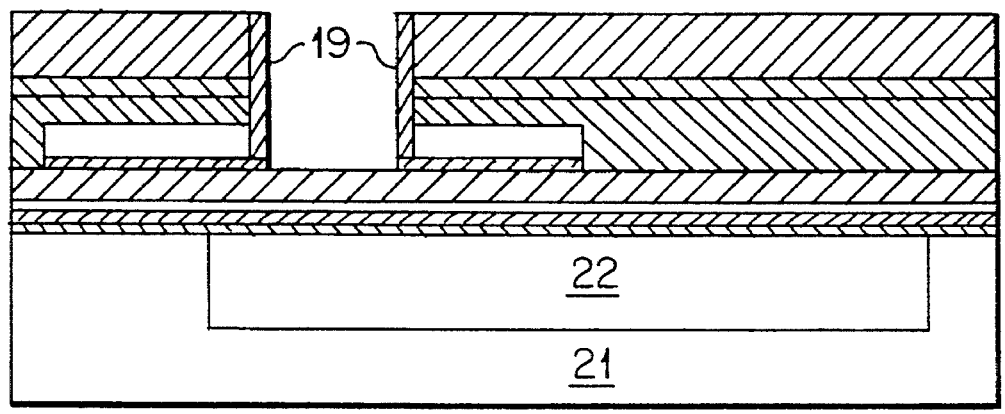

With reference to FIG. 3B, after defining active and inactive regions by using a patterned photoresist layer (not shown), the several layers on the oxide layer 26 are removed up to an upper surface of the oxide layer 26 using the patterned photoresist layer as a mask, whereby to form an opening, and then a side wall 19 is formed on both sides of the opening.

Figure 3C:
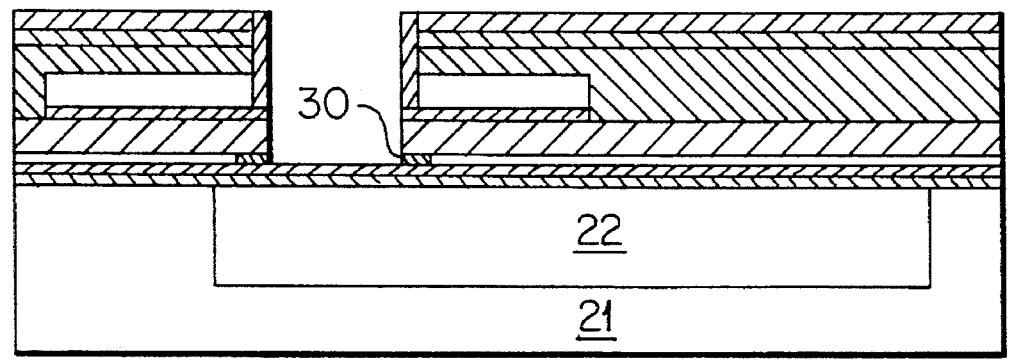

Subsequently, as shown in FIG. 3C, the exposed oxide layer 26 and the polysilicon layer 25 formed on the active region are sequentially removed up to an upper surface of the nitride layer 25, and then a side wall oxide layer 30 is formed on an exposed surface of the polysilicon layer 25 formed on the inactive region by thermal-annealing.

Figure 3D:
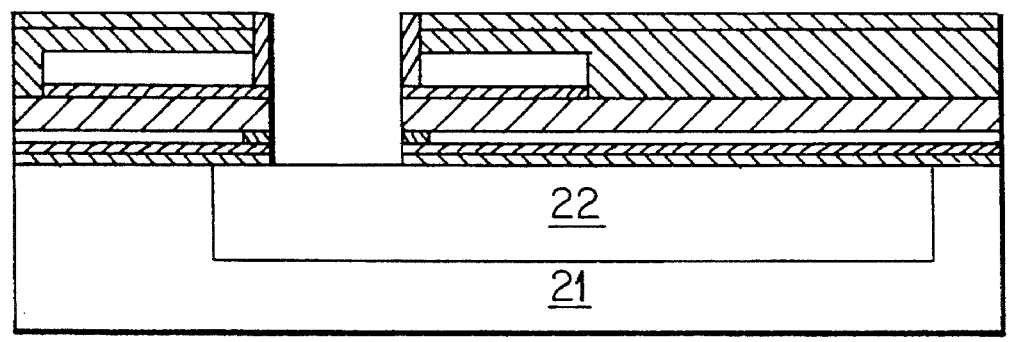

In addition, the exposed nitride layer 25 and the $SiO_2$ layer 23 on the active region are removed to expose a surface portion of the buried collector region 22, as shown in FIG. 3D.

Figure 3E:
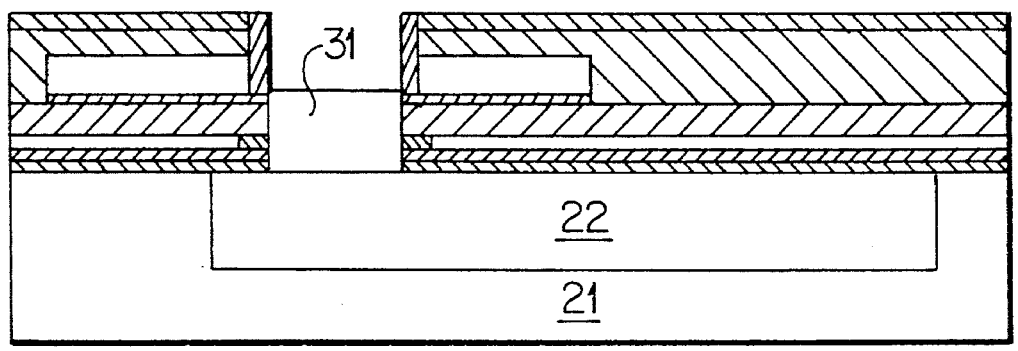

In the opening, a single crystal silicon collector 31 having a conductivity type is selectively grown on the surface portion of the buried collector region 22 up to a lower surface of the impurity doped polysilicon layer 28, as shown in FIG. 3E. That is, the height of the single crystal silicon collector 31 is controlled by the thickness of several layers formed between the polysilicon layer 28 and the substrate 21. An impurity is injected into the single crystal silicon collector 31, thereby allowing the single crystal silicon collector 31 to have a conductivity. In this embodiment, it is illustrated that the impurity is simultaneously injected while the single crystal silicon collector 31 is grown. However, after formation of the single crystal silicon collector 31 the impurity may be injected into the collector 31 by ion-injection or ion-diffusion and thermal-annealed, thereby allowing the single crystal silicon collector 31 to have a conductivity.

Figure 3F:
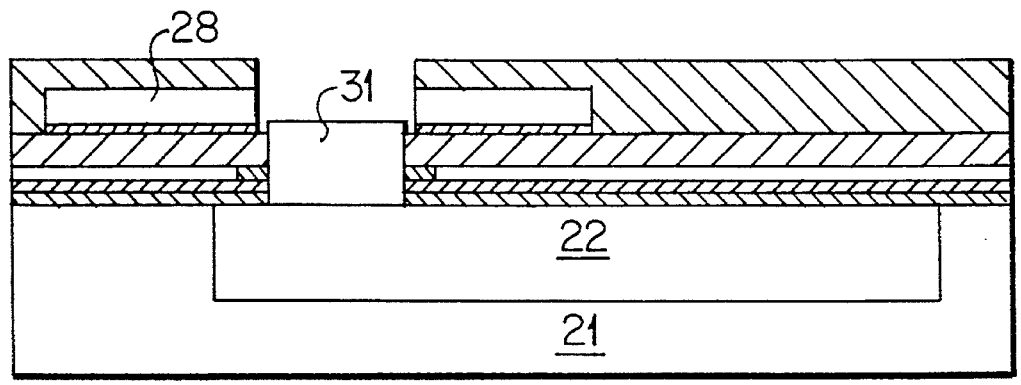
Figure 3G:
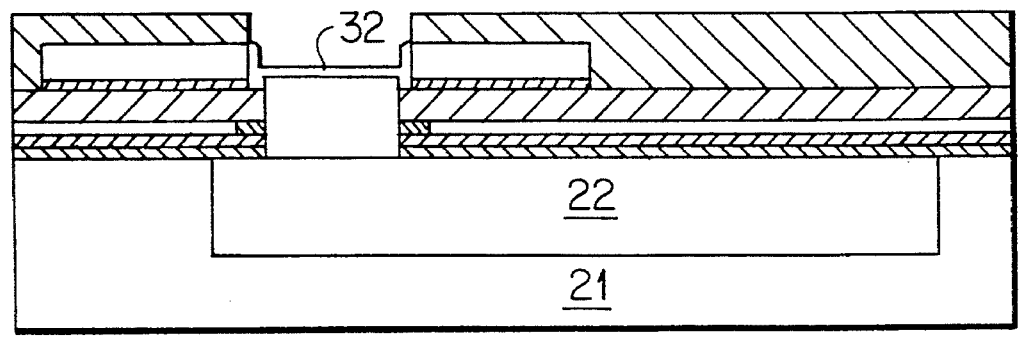

In FIG. 3F, the nitride layer 17 and the side wall 19 are removed to expose a side surface of the polysilicon layer 28 as an extrinsic base region. Next, a base 32 is selectively grown on an upper surface of the collector 31 and the exposed side surface of the extrinsic base 28, as shown in FIG. 3G. As the extrinsic base 32, a single crystal SiGe, SiGe/Si or Si/SiGe/Si can be used. In the case that SiGe is used as the extrinsic base 32, an impurity concentration of $1\times10^{18} cm^{-3}$ or more is injected therein. Also, in the case that Si/SiGe is used as the extrinsic base 32, an impurity concentration of $1\times10^{18} cm^{-3}$ or more is injected only an upper surface of the extrinsic base 32. Ge content of the SiGe base can be controlled linearly.

For example, the SiGe base can be formed in such a manner that Ge content is constant in the range of 30% or less, or the Ge content may be linearly changed from 30% up to 0% between the bottom and top of the SiGe base. Also, the SiGe base can be formed in such a manner that Ge content thereof is constant between the bottom of the base and a predetermined height in the range of 30% or less and is linearly changed between the predetermined height and the top of the base in the range of from 30% to 0%, or Ge content thereof is linearly increasingly changed between the bottom thereof and a predetermined height in the range of from 0% to 30% and decreasingly changed between the predetermined height and the top thereof in the range of from 30% to 0%. Herein, the term "linearly" means that Ge content of the base is increasingly or decreasingly changed.

Figure 3H:
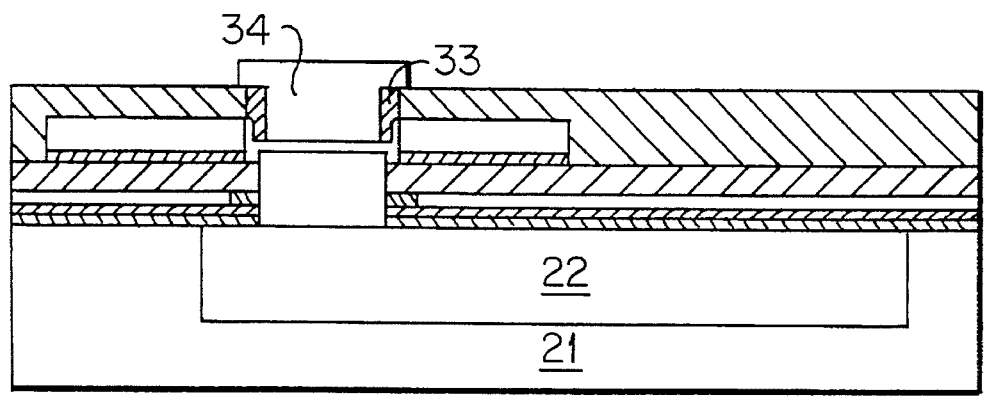

In addition, as shown in FIG. 3H, a side wall oxide layer 33 is formed on both sides of the base 32 and the silicon oxide layer 29 to define an emitter region, and then a polysilicon injected with an impurity concentration of $10^{20}$ $cm^{-3}$ or more is filled into the opening to form a conductive emitter 34.

If an n-p-n transistor is fabricated, BSG (boron silica glass) containing boron is used as the side wall oxide layer 33. On the other hand, if a p-n-p transistor is fabricated, PSG (phosphorous silica Glass) containing phosphorus is used as the side wall oxide layer 33.

Figure 3I:
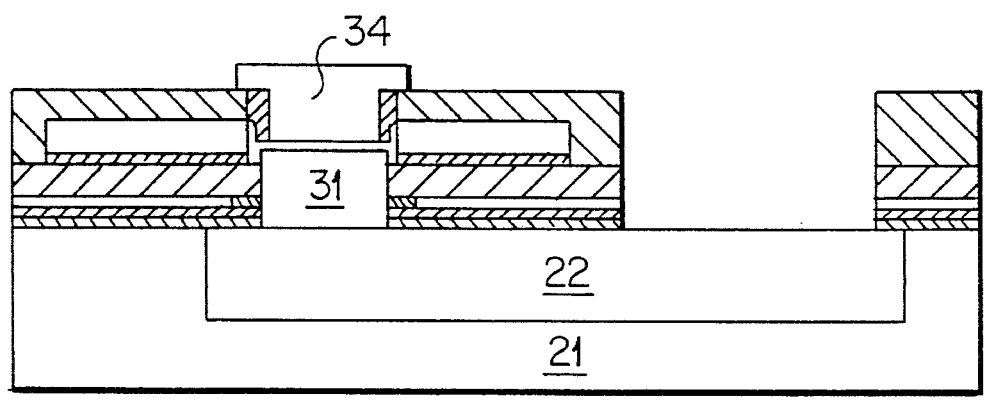
Figure 3J:
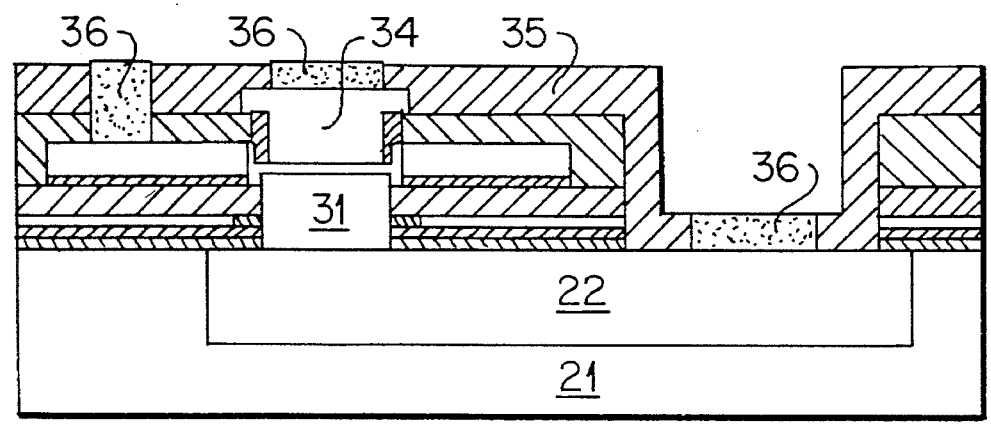

Finally, as shown in FIGS. 3I and 3J, after deposition of a protective layer 35 thereon, metal contact holes for the collector, emitter and base are formed. Then, metallization is carried out to form respective electrodes 36, and thus the fabricating processes are completed.

According to the fabricating method of the present invention, an active region is defined by a photolithography, and thereby a trench isolation acting as factors of lowering in integration and device-performance can be omitted in the method. As a result, fabrication sequence can be simplified and integration can be improved.

Additional, a parasitic capacitance can be significantly reduced because insulating layers formed between a substrate and an interconnection electrode can be controlled by several thin film which are patterned by the photolithography. As a result, reproduction of bipolar transistors and a yield of production thereof can be largely improved. Therefore, the bipolar transistor fabricated by the method of the present invention is applicable to a computer system required for a high-speed information processing and a low-power consumption, a communication system and the like.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art which this invention pertains.

What is claimed is:

1. A method for fabricating a bipolar transistor comprising the steps of:

forming a conductive buried collector region in a silicon substrate by using ion-implantation of an impurity and thermal-annealing;

sequentially forming a first silicon oxide layer, a first nitride layer, a first polysilicon layer, an oxide layer, a second nitride layer and a second polysilicon layer doped with an impurity;

selectively removing the second nitride and second polysilicon layers to form a pattern;

sequentially forming a second silicon oxide layer, a third nitride layer and a third silicon oxide layer thereon;

forming a patterned photoresist layer thereon to define active and inactive regions and removing those layers above said oxide layer on the active region to form an opening;

forming a side wall on both sides of the opening;

forming a collector on a surface portion of the buried collector region up to a lower surface of the second polysilicon layer;

removing the side wall and the third nitride layer to expose a side surface of the second polysilicon layer;

selectively forming a base on an upper surface of the collector including a side surface of the second polysilicon layer;

forming a first side wall oxide layer on both sides of the base and the second silicon oxide to define an emitter region;

forming an emitter on the base; and forming electrodes thereon.

2. The method as defined in claim 1, wherein the step of forming the opening further comprises removing the oxide layer and the first polysilicon layer formed on the active region, performing a thermal-annealing to oxidize an exposed portion of the first polysilicon layer and to form a second side wall oxide layer therein, and removing the first nitride and the first silicon oxide layers on the active region to expose a surface portion of the buried collector region.

3. The method as defined in claim 1, wherein the step of forming the collector comprises simultaneously performing impurity-injection together with a selective crystal growth, thereby allowing the collector to have a conductivity.

4. The method as defined in claim 1, wherein the step of forming the collector comprises forming a single crystal silicon layer on the exposed surface of the buried collector region by a selective crystal growth before injecting an impurity into the single crystal silicon layer.

5. The method as defined in claim 1, wherein the base is composed of a single crystal SiGe layer doped with an impurity having high concentration of at least $1 \times 10^{18}$ $cm^{-3}$.

6. The method as defined in claim 1, wherein the base is composed of one of a SiGe/Si layer and a Si/SiGe/Si layer.

7. The method as defined in claim 1, wherein Ge content of the base is linearly changed between bottom and top of the base.

8. The method as defined in claim 1, wherein Ge content of the base is constant in the range of no more than 3%.

9. The method as defined in claim 1, wherein Ge content of the base is linearly changed between bottom and top of the base in the range of from 30% to 0%.

10. The method as defined in claim 1, wherein Ge content of the base is constant between bottom and a first height of the base in the range of no more than 30% and is linearly changed between the first height and top of the base in the range of 30% to 0%.

11. The method as defined in claim 1, wherein Ge content of the base is linearly changed between bottom and a first height of the base in the range of 0% to 30% and changed between the first height and top of the base in the range of 30% to 0%.

12. The method as defined in claim 1, wherein the first side wall oxide layer is composed of one of a BSG containing boron and a PSG containing phosphorous.

* * * * *

UNITED STATES PATENT AND TRADEMARK OFFICE
CERTIFICATE OF CORRECTION

PATENT NO. : 5,484,737
DATED : January 16, 1996
INVENTOR(S) : RYUM ET AL

It is certified that error appears in the above-indentified patent and that said Letters Patent is hereby corrected as shown below:

On the title page, item [19], "Ryun et al." should read --Ryum et al.--

Signed and Sealed this

Fourteenth Day of May, 1996

Attest:

BRUCE LEHMAN

Attesting Officer     Commissioner of Patents and Trademarks